(12) United States Patent
Shimizu

(10) Patent No.: US 7,829,414 B2
(45) Date of Patent: Nov. 9, 2010

(54) METHOD FOR MANUFACTURING NON-VOLATILE SEMICONDUCTOR MEMORY DEVICE, AND NON-VOLATILE SEMICONDUCTOR MEMORY DEVICE

(75) Inventor: Shu Shimizu, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/537,652

(22) Filed: Aug. 7, 2009

(65) Prior Publication Data

US 2010/0219498 A1    Sep. 2, 2010

Related U.S. Application Data

(62) Division of application No. 11/172,886, filed on Jul. 5, 2005, now Pat. No. 7,592,226.

(30) Foreign Application Priority Data

Jul. 7, 2004   (JP)   ............................... 2004-200913

(51) Int. Cl.
*H01L 21/336* (2006.01)
(52) U.S. Cl. ...................................... 438/264; 438/257
(58) Field of Classification Search ................. None
See application file for complete search history.

(56) References Cited

U.S. PATENT DOCUMENTS 6,580,117 B2 *   6/2003   Shimizu ...................... 257/315

FOREIGN PATENT DOCUMENTS

| JP | 2000-150834 | 5/2000 |
| JP | 2003-23115 | 1/2003 |
| JP | 2003-078047 | 3/2003 |

OTHER PUBLICATIONS

Japanese Office Action issued in Japanese Patent Application No. JP 2004-200913 dated Feb. 2, 2010.

* cited by examiner

*Primary Examiner*—Ha Tran T Nguyen
*Assistant Examiner*—Valerie Brown
(74) *Attorney, Agent, or Firm*—McDermott Will & Emery LLP

(57) ABSTRACT

An isolation oxide film whose upper surface is higher than a surface of a substrate is formed in the substrate. A silicon oxide film is formed on the substrate between the isolation oxide films. A self-aligned polysilicon film is formed on the silicon oxide film between the isolation oxide films. After forming a resist pattern covering the peripheral circuitry, the isolation oxide films in the memory cell are etched by a predetermined thickness. An ONO film is formed on the entire surface of the substrate, a second resist pattern covering the memory cell is formed. Then, the ONO film, the polysilicon film 8 and the silicon oxide film 7 are removed from the peripheral circuitry.

1 Claim, 23 Drawing Sheets

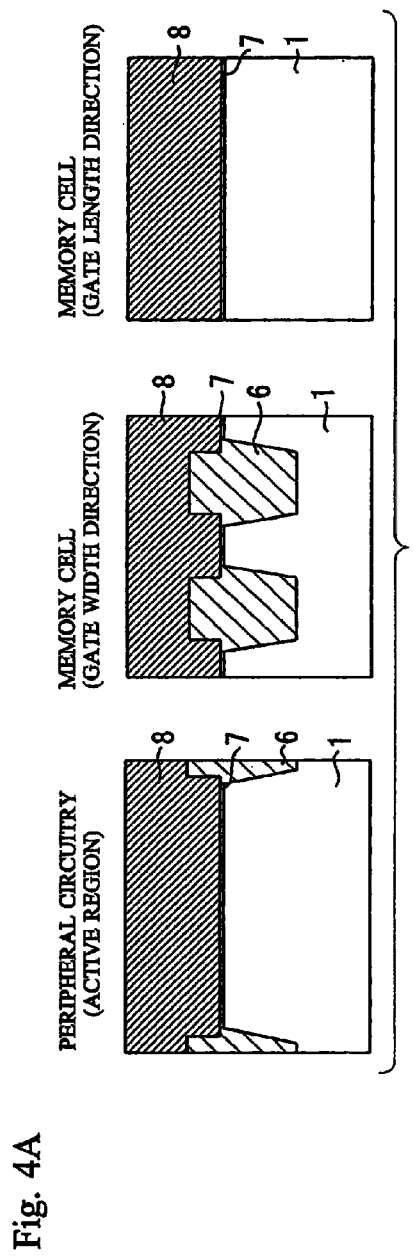
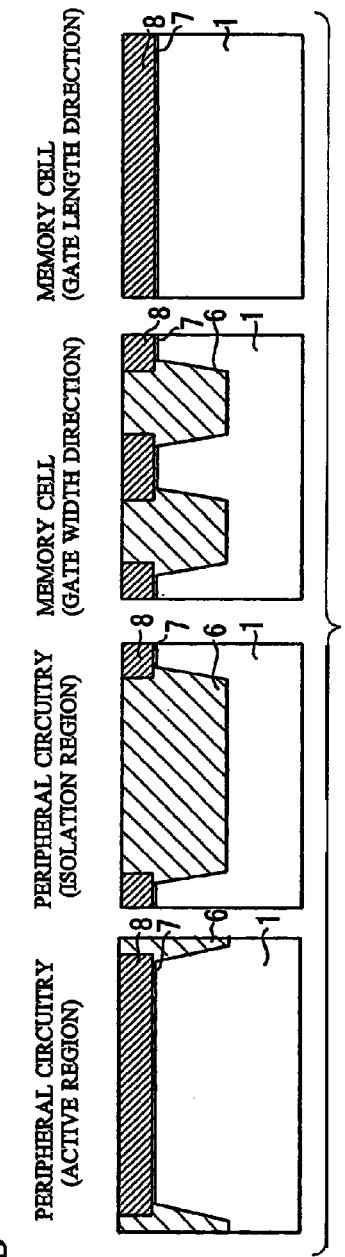
Fig. 4A
Fig. 4B

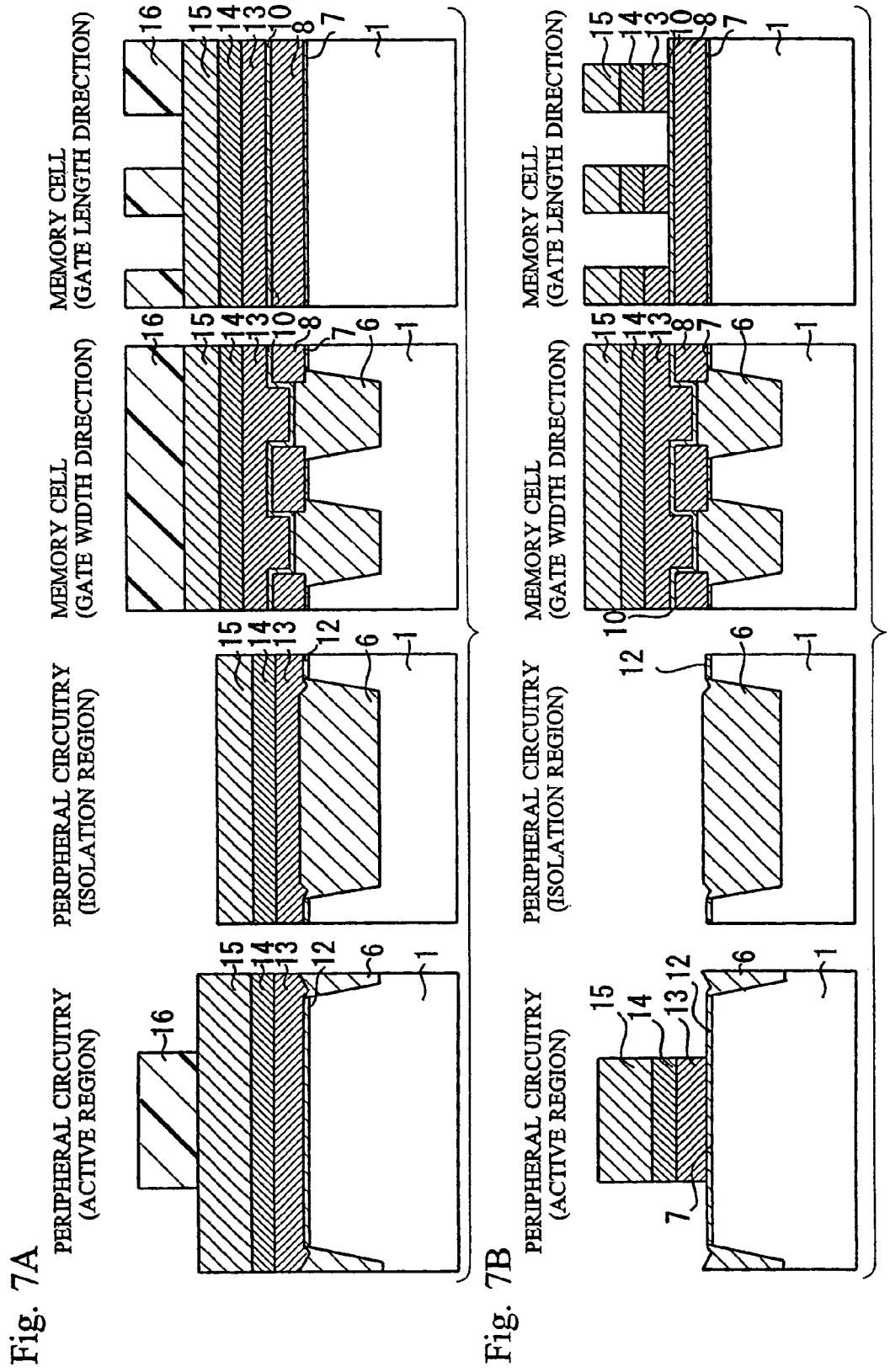

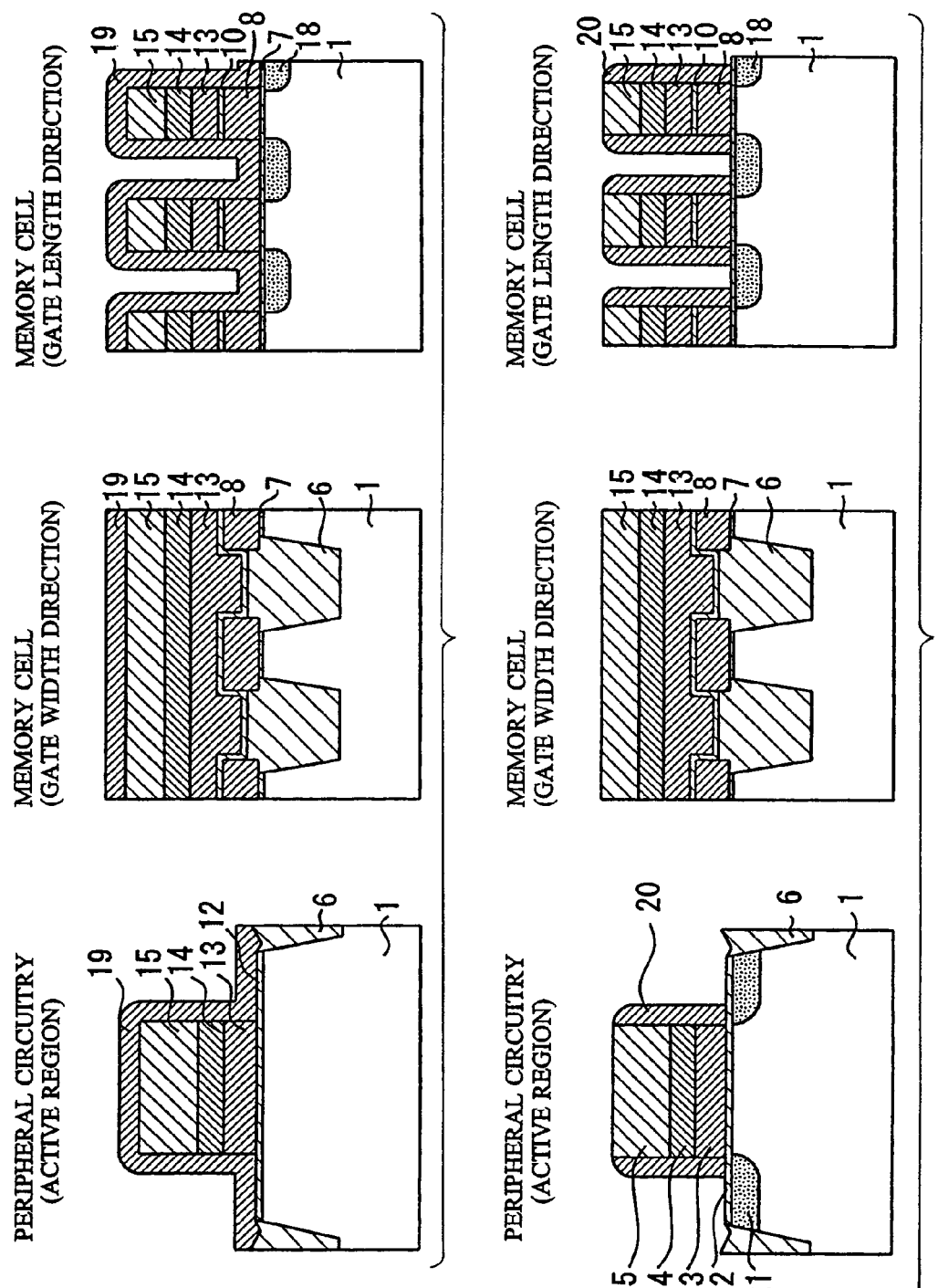

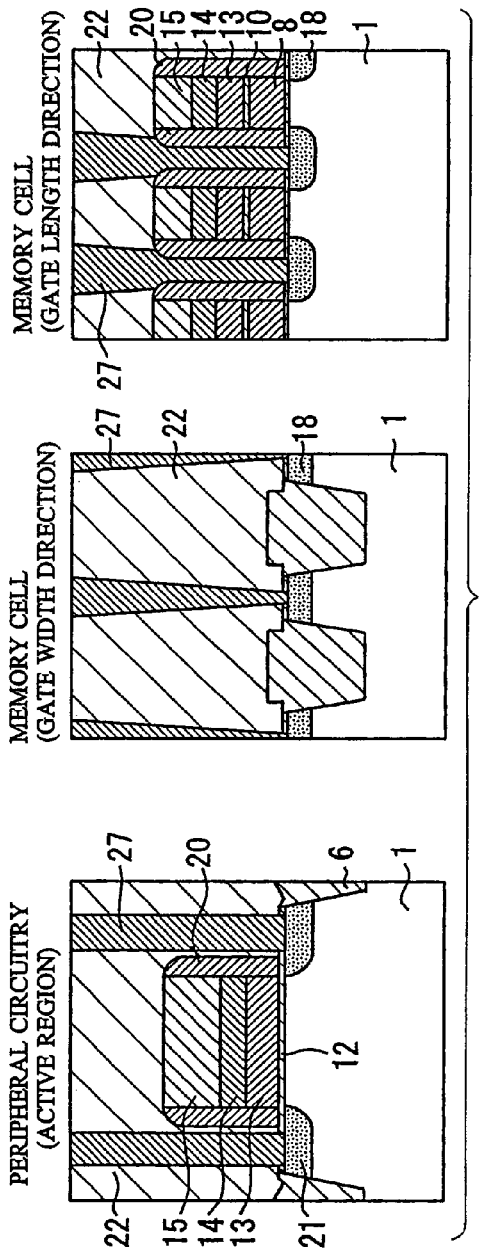

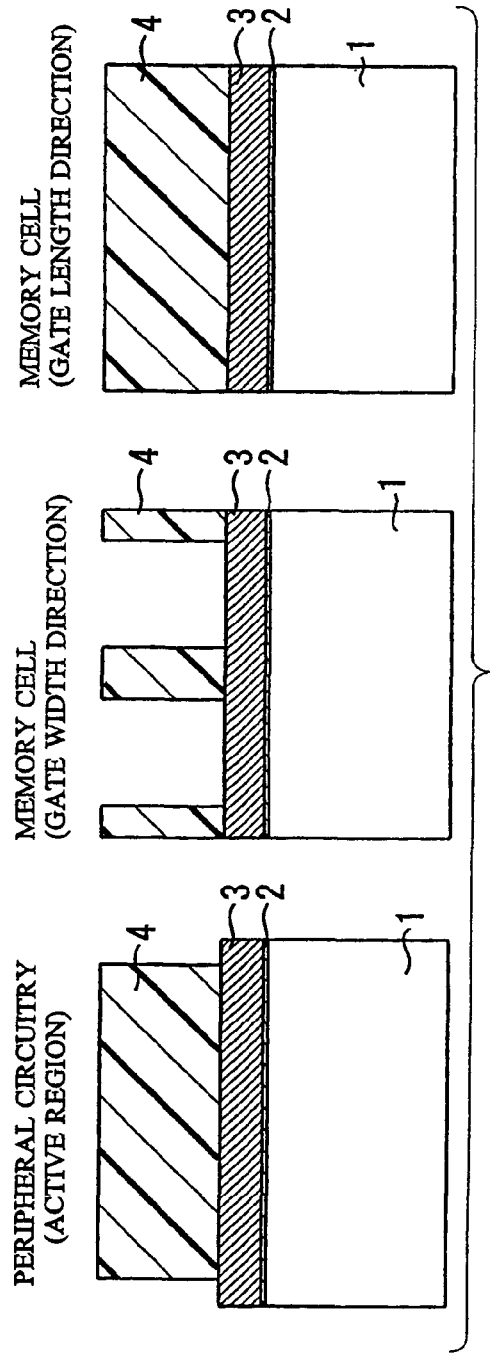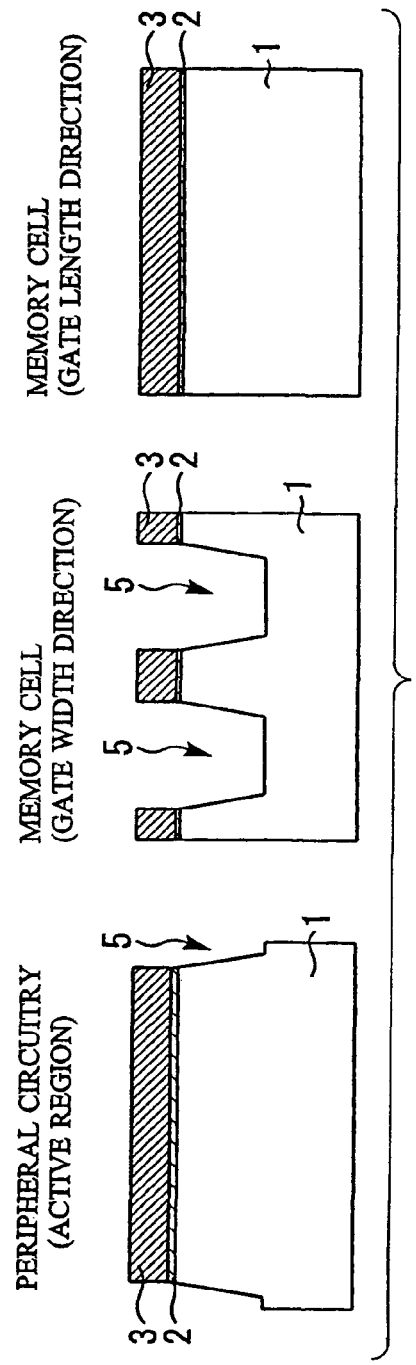
Fig. 17A  Background Art
Fig. 17B  Background Art

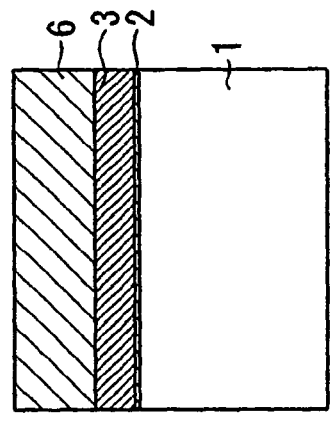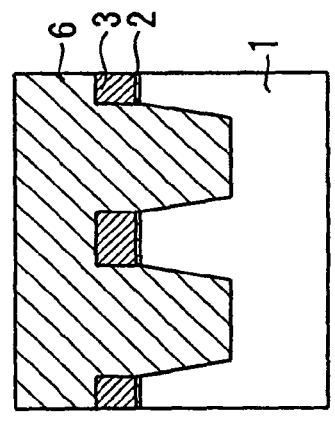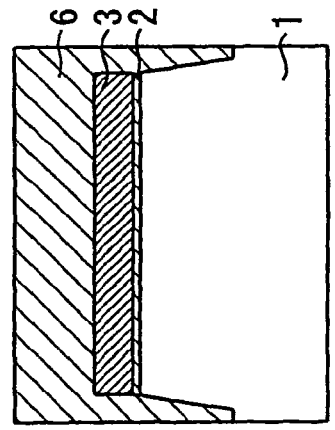
Fig. 18A  Background Art
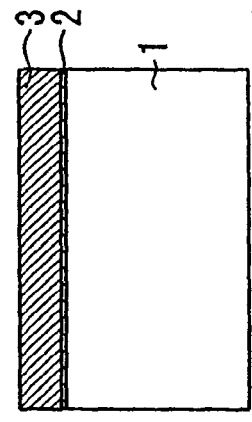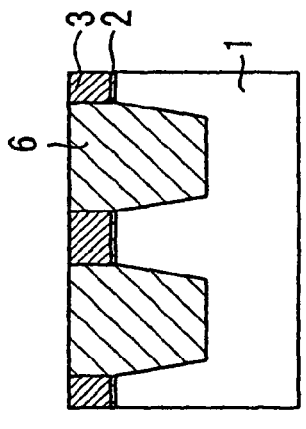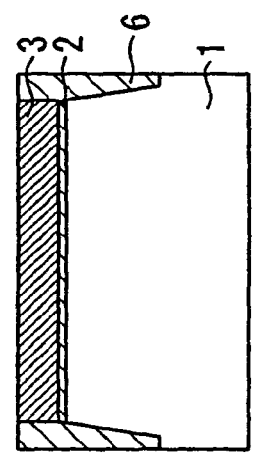
Fig. 18B  Background Art

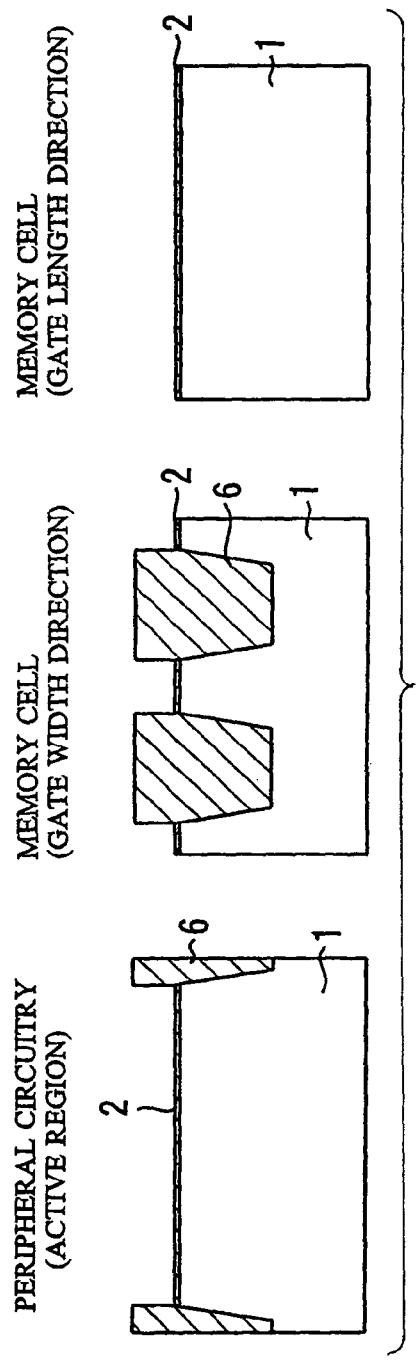
Fig. 19A  *Background Art*
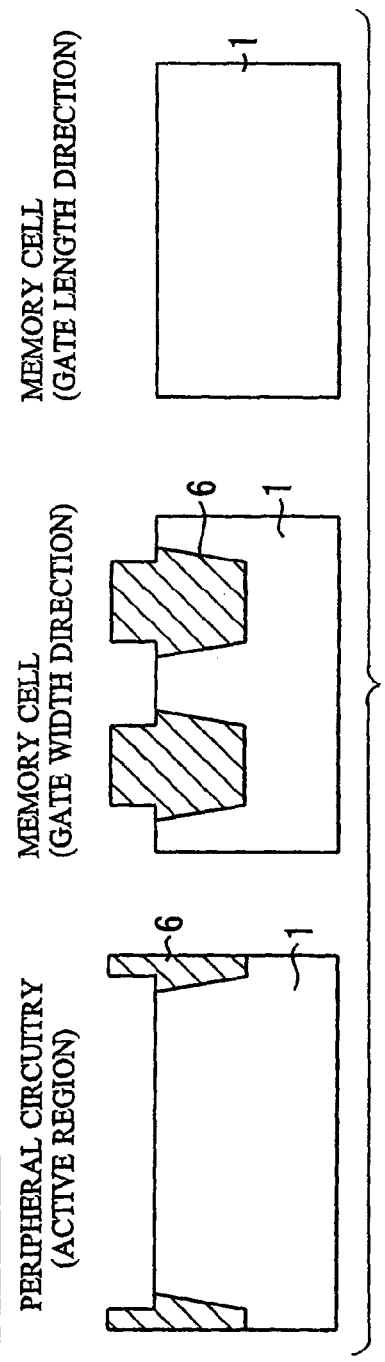
Fig. 19B  *Background Art*

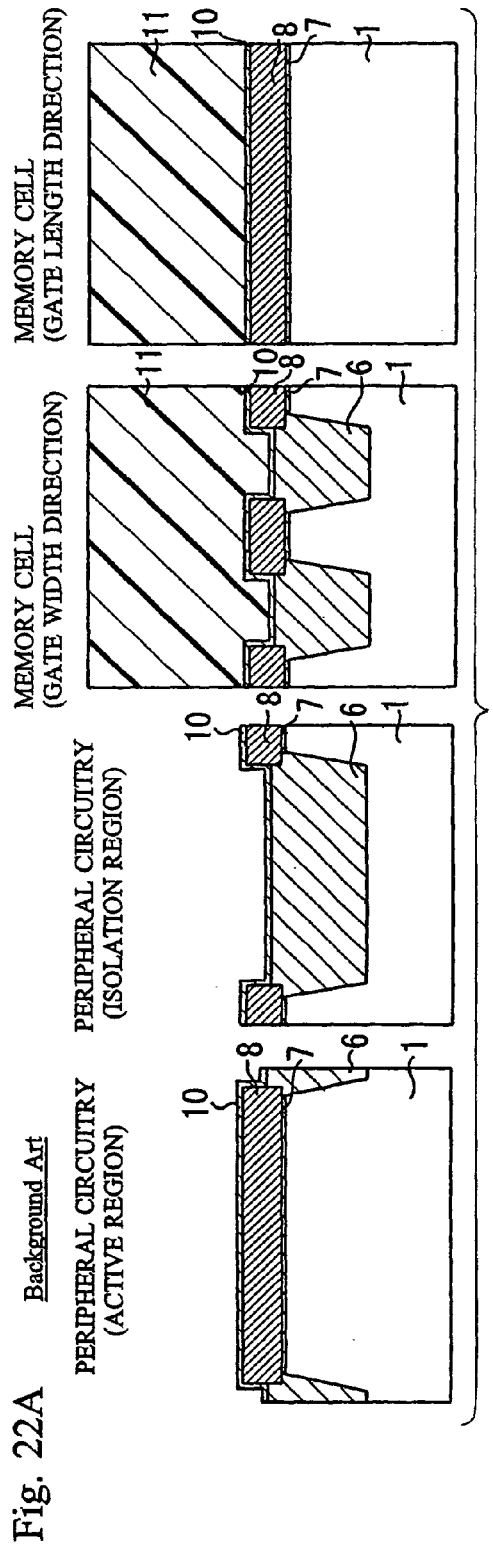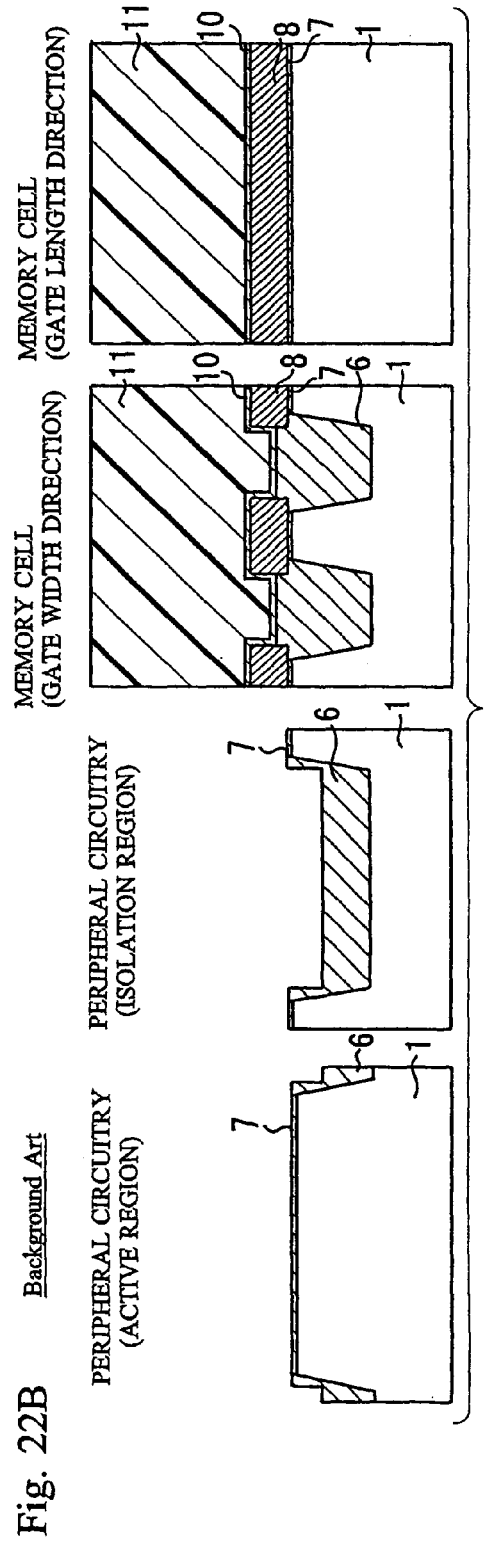
Fig. 22A  Background Art
Fig. 22B  Background Art

US 7,829,414 B2

METHOD FOR MANUFACTURING NON-VOLATILE SEMICONDUCTOR MEMORY DEVICE, AND NON-VOLATILE SEMICONDUCTOR MEMORY DEVICE

This application is a Divisional of U.S. application Ser. No. 11/172,886, filed Jul. 5, 2005 now U.S. Pat. No. 7,592,226, claiming priority of Japanese Application No. 2004-200913, filed Jul. 7, 2004, the entire contents of each of which are hereby incorporated by reference.

FIELD OF THE INVENTION

The present invention relates to a non-volatile semiconductor memory device and a method for manufacturing the same. Particularly the present invention relates to the prevention of occurrence of etching residue on element isolation of a peripheral circuitry adjacent to a memory cell.

DESCRIPTION OF THE BACKGROUND ART

Methods for improving coupling ratio of the memory cell of a non-volatile semiconductor memory device have been proposed (e.g., Japanese Patent Laid-Open No. 2003-23115).

As a method for improving the coupling ratio of a memory cell known by the present applicant, not a heretofore known technique, there is a method for enlarging the surface area of a floating gate electrode facing a control gate electrode by etching an isolation oxide film serving as element isolation structure by a predetermined thickness to expose the sides of a control electrode. This method will be described below.

FIGS. 17A to 24 are sectional process views for illustrating a method for manufacturing a non-volatile semiconductor memory device according to Background Art.

First, as FIG. 17A shows, a thermal oxide film 2 is formed on a silicon substrate 1, and a silicon nitride film 3 is formed on the thermal oxide film 2. Further, a resist pattern 4, whose portion corresponding to an element isolation region is opened, is formed on the silicon nitride film 3 using photoengraving.

Next, the silicon nitride film 3 and the thermal oxide film 2 are sequentially subjected to dry etching using the resist pattern 4 as a mask. Thereafter, the resist pattern 4 is removed. Then, the silicon substrate 1 is etched using the patterned silicon nitride film 3 as a mask. Thereby, as FIG. 17B shows, trenches 5 are formed in the silicon substrate 1.

Next, a thermal oxide film (not shown) is formed on the internal walls of the trenches 5. Thereafter, as FIG. 18A shows, a silicon oxide film 6 to be an isolation oxide film is formed on the entire surface of the substrate 1. Next, as FIG. 18B shows, the silicon oxide film 6 is planarized by a CMP (chemical mechanical polishing) method using the silicon nitride film 3 as a stopper film.

Next, the silicon nitride film 3 is removed using hot phosphoric acid to form a structure shown in FIG. 19A. Further, the thermal oxide film 2 is removed using hydrofluoric acid to form a structure shown in FIG. 19B. FIG. 25 is a top view showing active regions in a memory cell array according to Background Art. As FIG. 25 shows, a plurality of rectangular active regions A are formed in line in the shorter side direction. The isolation silicon oxide film 6 serving as element isolation structures is formed so as to isolate the active regions A.

Next, as FIG. 20A shows, a thermal oxide film 7 to be a tunnel oxide film is formed on the surface of the substrate 1. A polysilicon film 8 to be a floating gate electrode of the memory cell is formed on the entire surface of the substrate 1.

Next, as FIG. 20B shows, the polysilicon film 8 is planarized by a CMP method using the isolation oxide film 6 as a stopper film. Thereby, the surface of the silicon oxide film 6 has the same height as the surface of the polysilicon film 8. Here, the polysilicon film 8 is self-aligned to the isolation oxide film 6.

Next, as FIG. 21A shows, the isolation silicon oxide film 6 is selectively etched by a predetermined thickness using hydrofluoric acid. Thereby, the upper portions of the sides of the polysilicon film 8 are exposed. Therefore, the surface area of the floating gate electrode 8 facing the control gate electrode can be enlarged, and the coupling ratio of the memory cell can be improved.

Thereafter, as FIG. 21B shows, an ONO film 10 is formed on the entire surface of the substrate 1. The ONO film 10 is made by stacking a silicon oxide film, a silicon nitride film and a silicon oxide film.

Next, as FIG. 22A shows, a resist pattern 11 covering the memory cell region is formed using photoengraving.

Then, as FIG. 22B shows, the ONO film 10 and the polysilicon film 8 of the peripheral circuitry are sequentially subjected to dry etching using the resist pattern 11 as a mask. Further, the thermal oxide film 7 of the peripheral circuitry is removed using hydrofluoric acid. Thereafter, the resist pattern 11 is removed to form a structure shown in FIG. 23A. Here, as FIG. 23A shows, in the peripheral circuitry, the surface of the isolation oxide film 6 falls below the surface of the substrate 1 to produce a step B. The step B causes problems described below.

Next, as FIG. 23B shows, in the peripheral circuitry, a thermal oxide film 12 to be a gate oxide film is formed on the surface of the substrate 1. Then, a polysilicon film 13 and a WSi film 14 as conductive films to be the control gate electrode of the memory cell and to be the gate electrode of the peripheral circuitry are sequentially formed. A silicon nitride film 15 is formed on the WSi film 14. Further, a resist pattern 16 covering the control gate electrode portion and the gate electrode portion is formed on the silicon nitride film 15 using photoengraving.

Next, as FIG. 24 shows, the silicon nitride film 15 is subjected to dry etching using the resist pattern 16 as a mask. Thereafter, the resist pattern 16 is removed. Then, the WSi film 14 and the polysilicon film 13 are sequentially subjected to dry etching using the patterned silicon nitride film 15 as a mask. At this time, since the step B is present on the element isolation oxide film 6 of the peripheral circuitry as described above, there is high possibility that etching residues (polysilicon residues) 13a are formed in the portion of the step B.

In the above-described manufacturing method, when the isolation oxide film 6 was etched in order to improve the coupling ratio of the memory cell, the isolation oxide film 6 in the peripheral circuitry was also etched. Therefore, when the ONO film 10 and the thermal oxide film 7 in the peripheral circuitry were removed, there was a problem that the isolation oxide film 6 was further etched, the isolation oxide film 6 fell much below the surface of the substrate 1, and the step B was formed. Therefore, when the gate electrode was patterned, there was a problem that etching residues 13a were formed in the step B. There was a problem that the circuit elements that should be insulated under normal circumstances were conducted through the residues 13a, and thereby causing a defective circuit.

SUMMARY OF THE INVENTION

The present invention has been conceived to solve the previously-mentioned problems and a general object of the present invention is to provide a novel and useful method for manufacturing a non-volatile semiconductor memory device, and is to provide a novel and useful non-volatile semiconductor memory device.

A more specific object of the present invention is to manufacture a non-volatile semiconductor memory device having a memory cell with a high coupling ratio, without forming etching residues on the element isolation structure in the peripheral circuitry.

According to first aspect of the present invention, in the method for manufacturing a non-volatile semiconductor memory device, element isolation structures for isolating active regions are first formed in a substrate, wherein an upper surface of the element isolation structure is higher than a surface of the substrate. A silicon oxide film is formed on the substrate between the element isolation structures. A polysilicon film is formed on the silicon oxide film between the element isolation structures using a self-align process. A first resist pattern covering a peripheral circuitry adjacent to a memory cell is formed. The element isolation structures in the memory cell are etched by a predetermined thickness using the first resist pattern as a mask. A multilayer insulation film is formed on an entire surface of the substrate. A second resist pattern covering the memory cell is formed. The multilayer insulation film, the polysilicon film and the silicon oxide film are removed from the peripheral circuitry using the second resist pattern as a mask. A gate insulation film is formed on the substrate of the peripheral circuitry. A conductive film is formed on the entire surface of the substrate. The conductive film on the peripheral circuitry and the memory cell are patterned to form a patterned conductive film. The multilayer insulation film and the polysilicon film on the memory cell are patterned using the patterned conductive film as a mask.

According to second aspect of the present invention, in the method for manufacturing a non-volatile semiconductor memory device, element isolation structures for isolating active regions are first formed in a substrate, wherein an upper surface of the element isolation structure is higher than a surface of the substrate. A silicon oxide film to be a tunnel oxide film is formed on the substrate between the element isolation structures. A polysilicon film to be a floating gate electrode is formed on the silicon oxide film between the element isolation structures using self-align process. A first resist pattern covering a peripheral circuitry adjacent to a memory cell is formed. The element isolation structures in the memory cell are etched by a predetermined thickness using the first resist pattern as a mask, to expose upper portions of sides of the polysilicon film in the memory cell. A multilayer insulation film is formed on an entire surface of the substrate, after removing the first resist pattern. A second resist pattern covering the memory cell is formed. The multilayer insulation film, the polysilicon film and the silicon oxide film are removed from the peripheral circuitry using the second resist pattern as a mask. A gate insulation film is formed on the substrate of the peripheral circuitry, after removing the silicon oxide film from the peripheral circuitry. A conductive film to be a gate electrode or a floating gate electrode is formed on the entire surface of the substrate. The conductive film on the peripheral circuitry and the memory cell are patterned to form a gate electrode on the gate insulation film of the peripheral circuitry, and to form a control gate electrode on the multilayer insulation film of the memory cell. The multilayer insulation film and the polysilicon film on the memory cell are patterned using the control gate electrode as a mask, to form a floating gate electrode.

According to third aspect of the present invention, the non-volatile semiconductor memory device having a memory cell and peripheral circuitry adjacent to the memory cell comprises element isolation structures for isolating active regions in a substrate; and semiconductor elements formed on the active regions. The active regions of the memory cell include a plurality of rectangular first active regions arrayed in the lateral direction; and second active regions connecting ends of the first active regions to each other, the second active regions surrounding the memory cell. An upper surface of the element isolation structure in the peripheral circuitry has a height equivalent to a height of the surface of the substrate, or higher than the height of the surface of the substrate.

Other objects and further features of the present invention will be apparent from the following detailed description when read in conjunction with the accompanying drawings.

BRIEF DESCRIPTION OF THE DRAWINGS

FIGS. 1A to 11B are sectional process diagrams for illustrating a method for manufacturing a non-volatile semiconductor device according to an embodiment of the present invention;

FIGS. 17A to 24 are sectional process views for illustrating a method for manufacturing a non-volatile semiconductor memory device according to Background Art.

DETAILED DESCRIPTION OF THE PREFERRED EMBODIMENTS

Figure 1A:
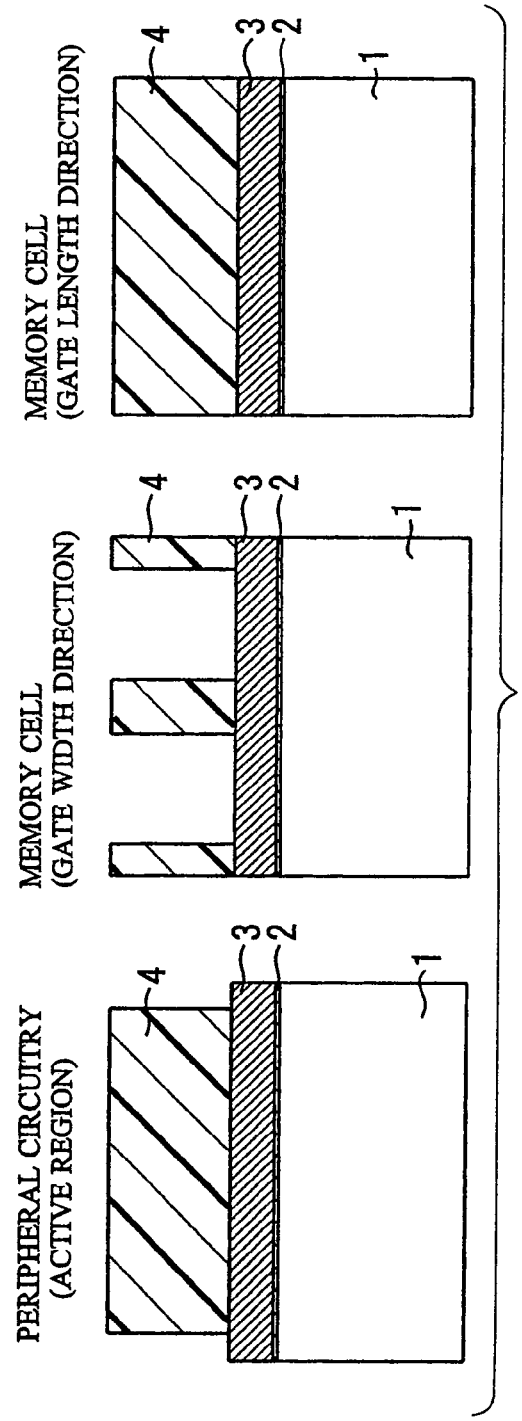

In the following, principles and embodiments of the present invention will be described with reference to the accompanying drawings. The members and steps that are common to some of the drawings are given the same reference numerals and redundant descriptions therefore may be omitted.

A method for manufacturing a non-volatile semiconductor device according to an embodiment of the present invention will be described below referring to the drawings.

FIGS. 1A to 11B are sectional process diagrams for illustrating the method for manufacturing a non-volatile semiconductor device according to an embodiment of the present invention.

In each drawing, a cross section of an active region of a peripheral circuitry, and a cross sections of a memory cell in a gate width direction and a gate length direction are shown. As required, a cross section of an element isolation region of the peripheral circuitry is shown.

First, as FIG. 1A shows, a silicon oxide film (hereafter referred to as "thermal oxide film") 2 having a thickness of for example about 10 nm is formed on a substrate (e.g., a silicon substrate) 1 using a thermal oxidation method. Then, a silicon nitride film 3 having a thickness of for example about 100 nm is formed on the thermal oxide film 2 using a CVD (chemical vapor deposition) method. Further, a resist pattern 4 covering the portions corresponding to active regions, whose portions corresponding to element isolation regions are opened, is formed on the silicon nitride film 3 using photoengraving.

Figure 1B:
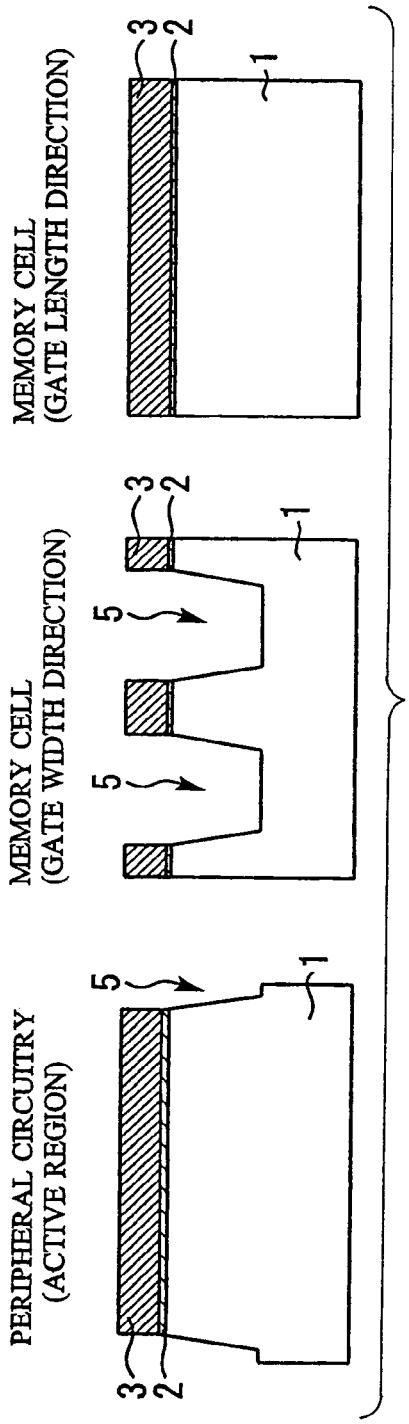

Next, the silicon nitride film 3 and the thermal oxide film 2 are sequentially subjected to dry etching using the resist pattern 4 as a mask. Thereafter, the resist pattern 4 is removed. Then, the silicon substrate 1 is etched using the patterned silicon nitride film 3 as a mask. Thereby, as FIG. 1B shows, trenches 5 having a thickness of about 200 to 300 nm and extending openings of the silicon nitride film 3 are formed in the substrate 1.

Figure 2A:
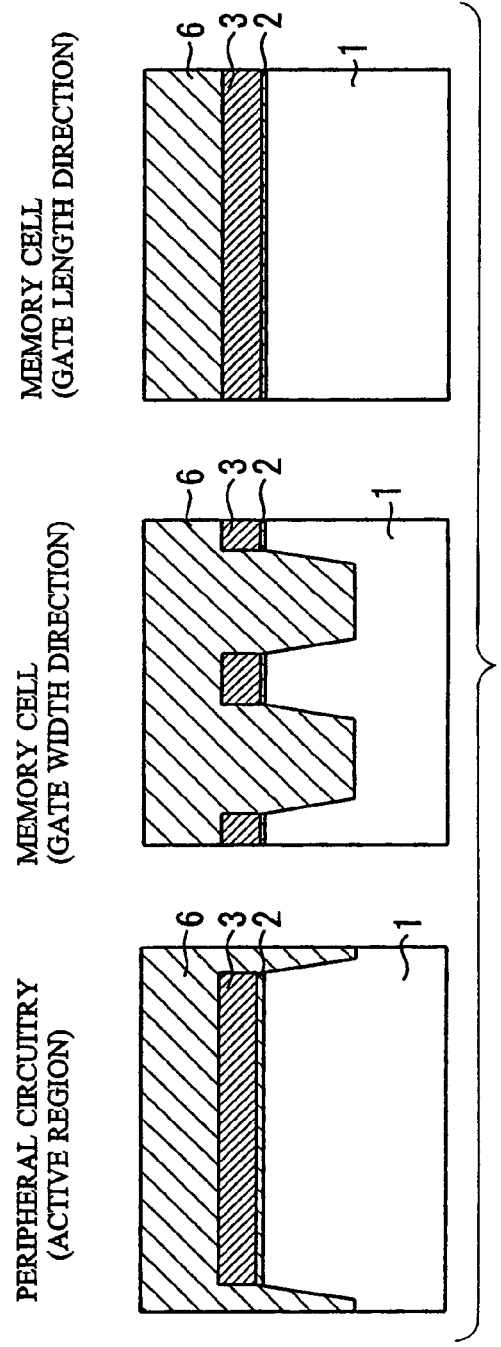

Next, a thermal oxide film (not shown) is formed on internal walls of the trenches 5. Thereafter, as FIG. 2A shows, a silicon oxide film 6 having a thickness of for example about 500 nm to be an isolation oxide film is formed on the entire surface of the substrate 1. Thereby, the trenches 5 and the openings of the silicon nitride film 3 are embedded by the silicon oxide film 6.

Figure 2B:
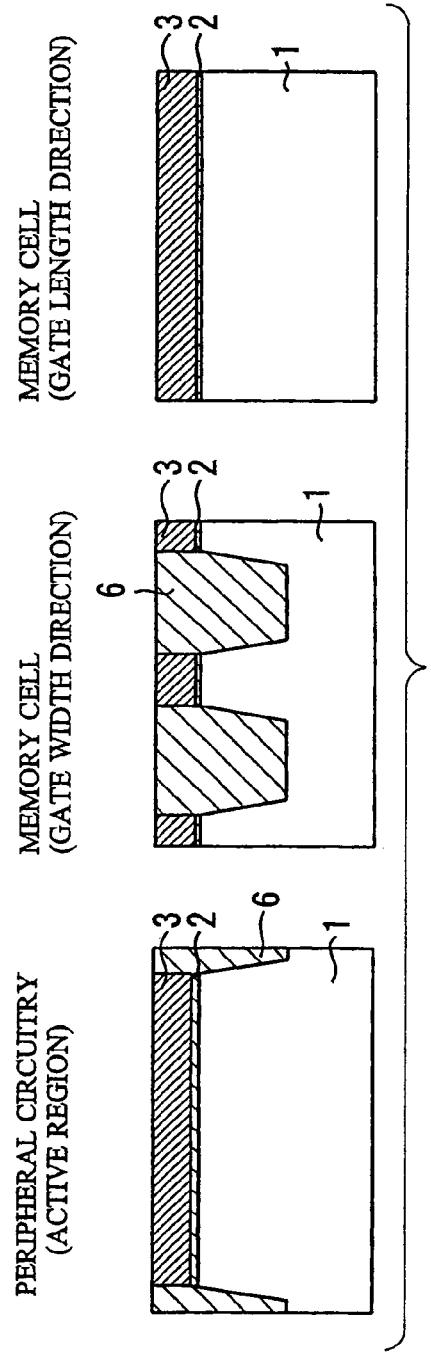

Next, as FIG. 2B shows, the silicon oxide film 6 is planarized by a CMP method using the silicon nitride film 3 as a stopper film. Thereby, the surface of the silicon oxide film 6 has the same height as the surface of the silicon nitride film 3.

Figure 3A:
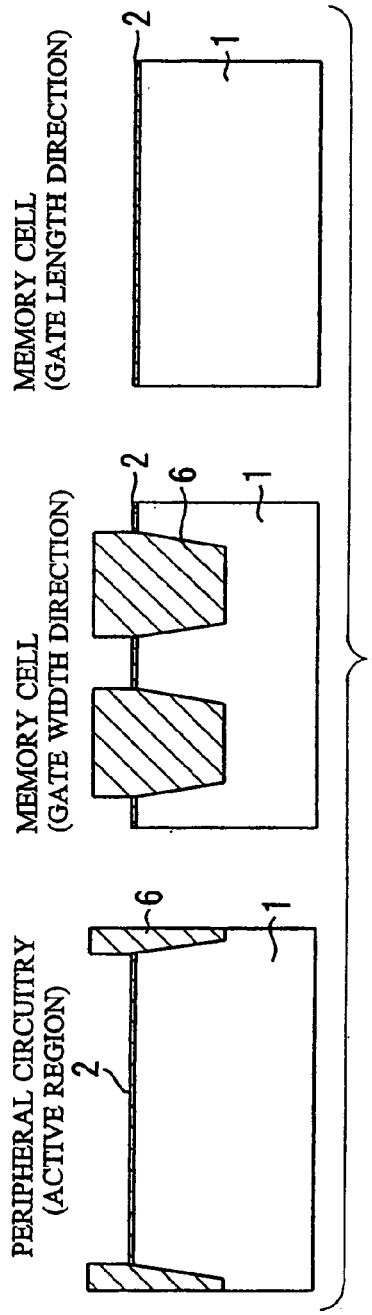
Figure 3B:
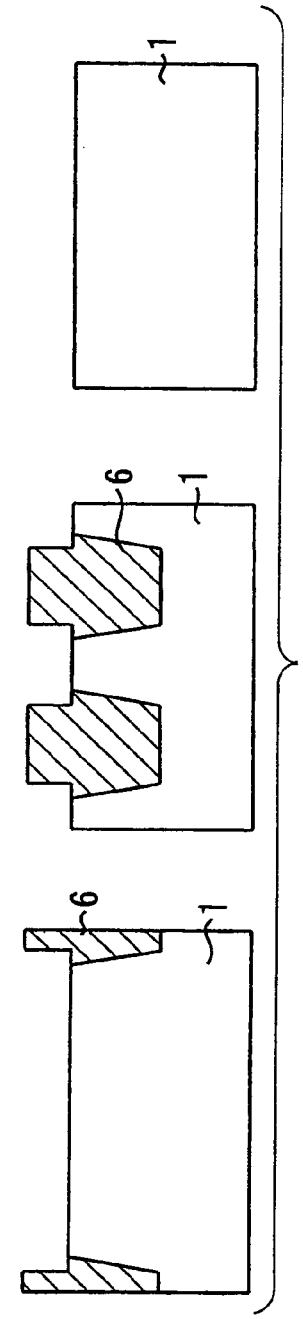
Figure 12:
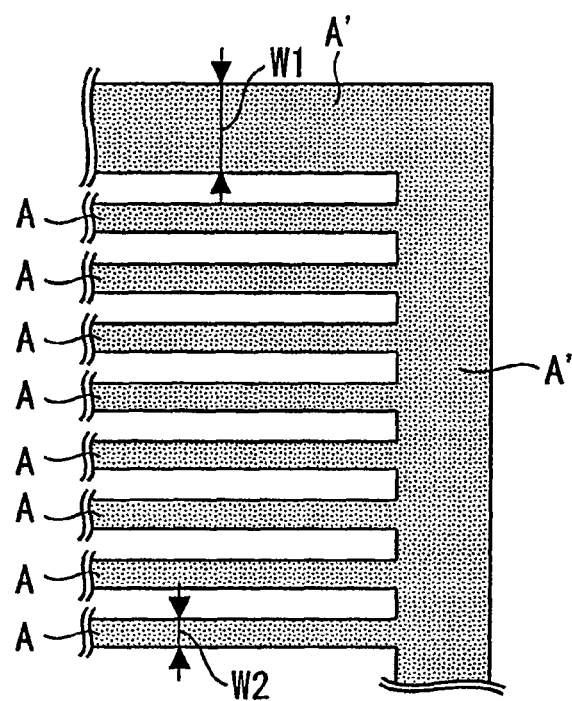
FIG. 12 is a top view showing active regions in a memory cell array according to the embodiment of the present invention.
Figure 25:
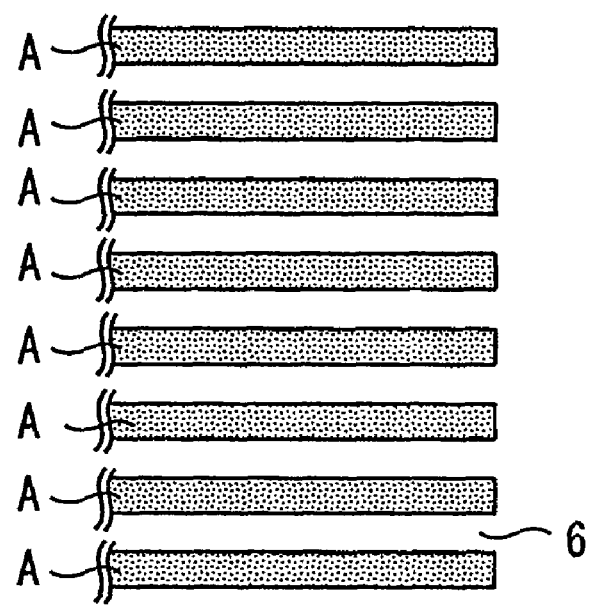
FIG. 25 is a top view showing active regions in a memory cell array according to Background Art.

Next, the silicon nitride film 3 is removed using hot phosphoric acid to form a structure shown in FIG. 3A. Further, the thermal oxide film 2 is removed using hydrofluoric acid to form a structure shown in FIG. 3B. Thereby, an isolation oxide film 6 having the upper surface higher than the surface of the substrate 1, that is, the isolation oxide film 6 having the upper surface protruding from the surface of the substrate 1, is formed. FIG. 12 is a top view showing active regions in a memory cell array according to the embodiment of the present invention. As FIG. 12 shows, a plurality of rectangular active regions A are formed in line in the shorter side direction, and the isolation silicon oxide film 6 serving as element isolation structures is formed so as to isolate the active regions A. Unlike the conventional memory cell array shown in FIG. 25 according to Background Art, in this embodiment, an active region A' is formed at an end portion of the memory cell array. That is to say, the memory cell array is surrounded by the active region A'. The active region A' is formed in the boundary area between the memory cells and the peripheral circuitry. Around the active region A', element isolation structures (isolation oxide film 6) for isolating the peripheral circuitry are formed. The active region A' formed at the end portion of the memory cell array connects the end portions of rectangular active regions A to each other. The width W1 of the active region A' is made at least wider than the width W2 of the rectangular active regions A. At the end portions of the active regions A, a dummy gate or the like can be formed.

Next, as FIG. 4A shows, a silicon oxide film 7 to be a tunnel oxide film is formed on an exposed surface of the substrate 1 using the thermal oxidation method. Thereafter, a polysilicon film 8 of a thickness of for example about 150 nm to be a floating gate electrode of the memory cell is formed. Thereby the isolation oxide film 6 is covered with the polysilicon film 8.

Next, as FIG. 4B shows, the polysilicon film 8 is planarized by a CMP method using the isolation oxide film 6 as a stopper film. Thereby, the surface of the silicon oxide film 6 has the same height as the surface of the polysilicon film 8. Here, the polysilicon film 8 is self-aligned to the isolation oxide film 6. Therefore, a floating gate electrode 8 self-aligned to the isolation oxide film 6 is formed. The highly accurate alignment of the isolation oxide film 6 to the floating gate electrode 8, which is required when photoengraving is used, is not required.

Figure 5A:
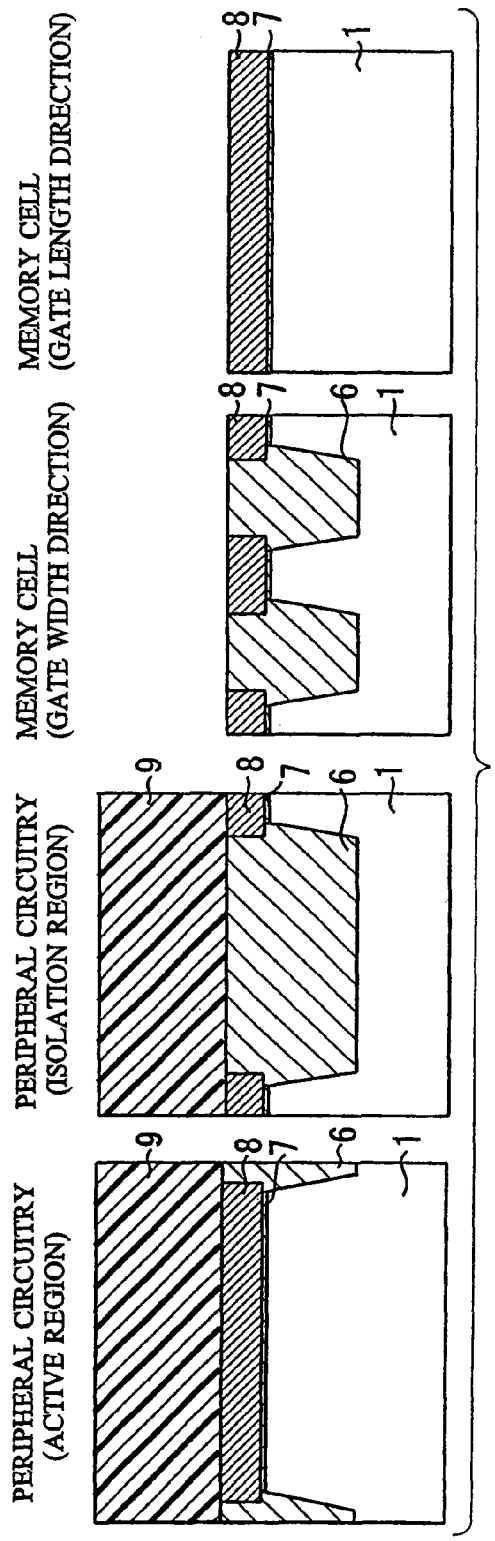
Figure 5B:
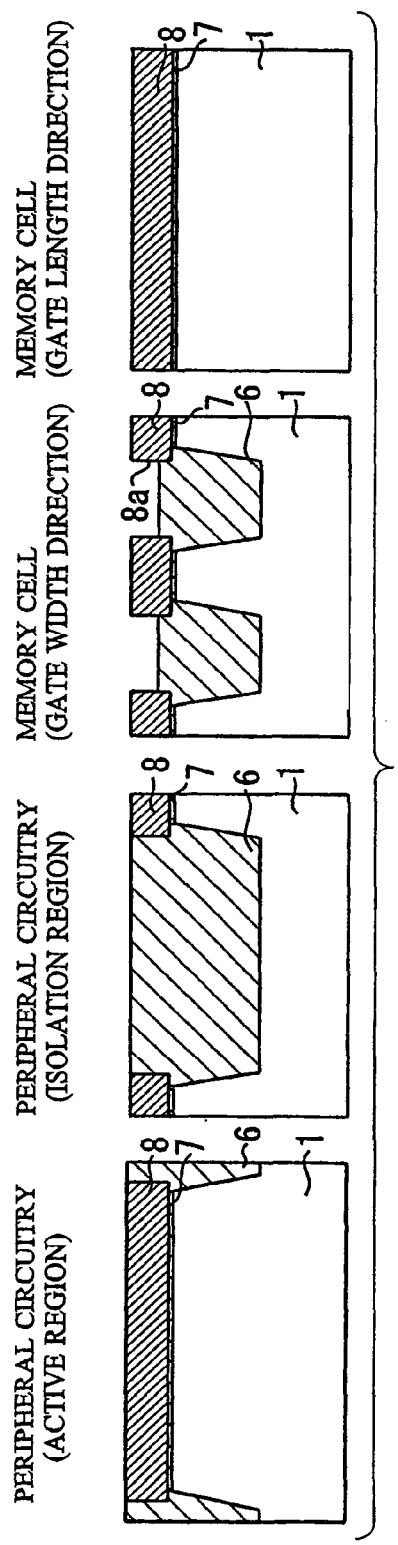
Figure 13:
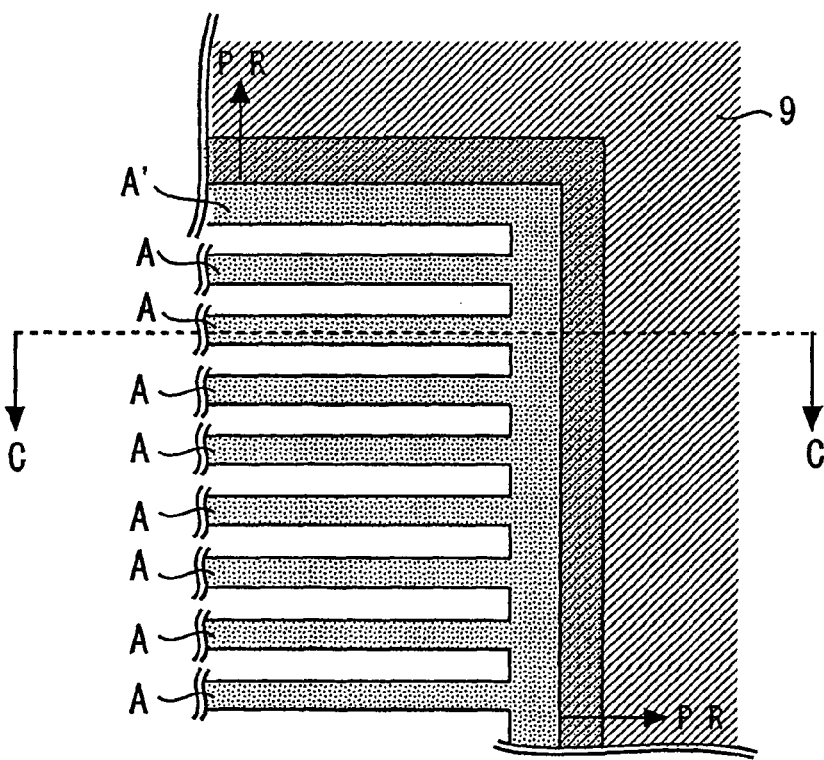
FIG. 13 is a top view showing positional relationship between active regions in a memory cell and a resist pattern covering a peripheral circuitry according to the embodiment of the present invention.
Figure 14:
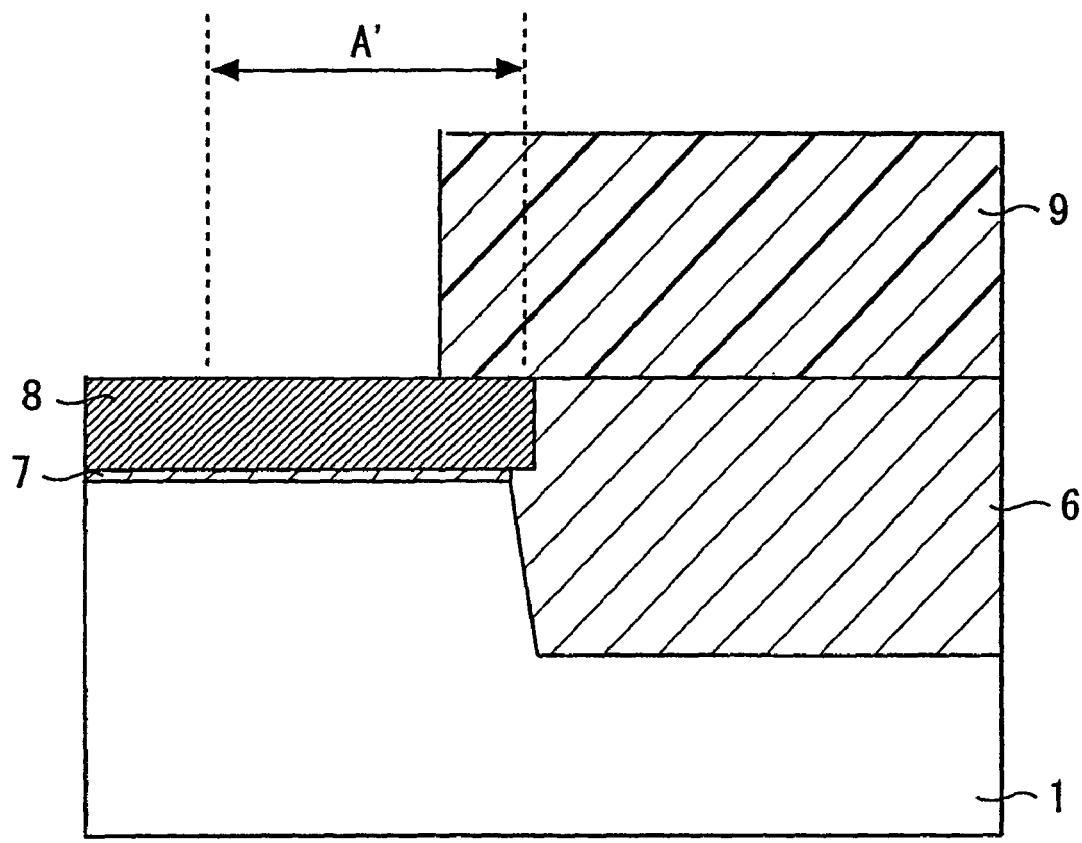
FIG. 14 is a sectional view showing a cross section of C-C in FIG. 13.

Next, as FIG. 5A shows, a resist pattern 9 covering the peripheral circuitry is formed. Here, the formation of a wide active region A' at an end portion of the memory array was described above (refer to FIG. 12). In this step, as FIGS. 13 and 14 show, the resist pattern 9 is disposed so that the end portion of the resist pattern 9 is located on the active regions A. Thereby, the surface of the isolation oxide film 6 in the peripheral circuitry in the vicinity of the boundary with the memory cell is covered with the resist pattern 9. The width W1 of the active region A' is set to a width considering an overlaying margin of the resist pattern 9 and the variation of the sizes, so that the end portion of the resist pattern 9 does not deviate from the active region A'.

Next, the isolation oxide film 6 in the memory cell is etched using hydrofluoric acid by a predetermined thickness. Thereafter, the resist pattern 9 is removed to form a structure shown in FIG. 5B. Since a part of the sides 8a of the polysilicon film 8 is exposed by the etching of the isolation oxide film 6, the surface area of the floating gate electrode 8 facing the control gate electrode (described below) is enlarged. Therefore, the coupling ratio of the memory cell is improved. At this time, since the peripheral circuitry is masked by the resist pattern 9, the isolation oxide film 6 in the peripheral circuitry is not etched.

Figure 6A:
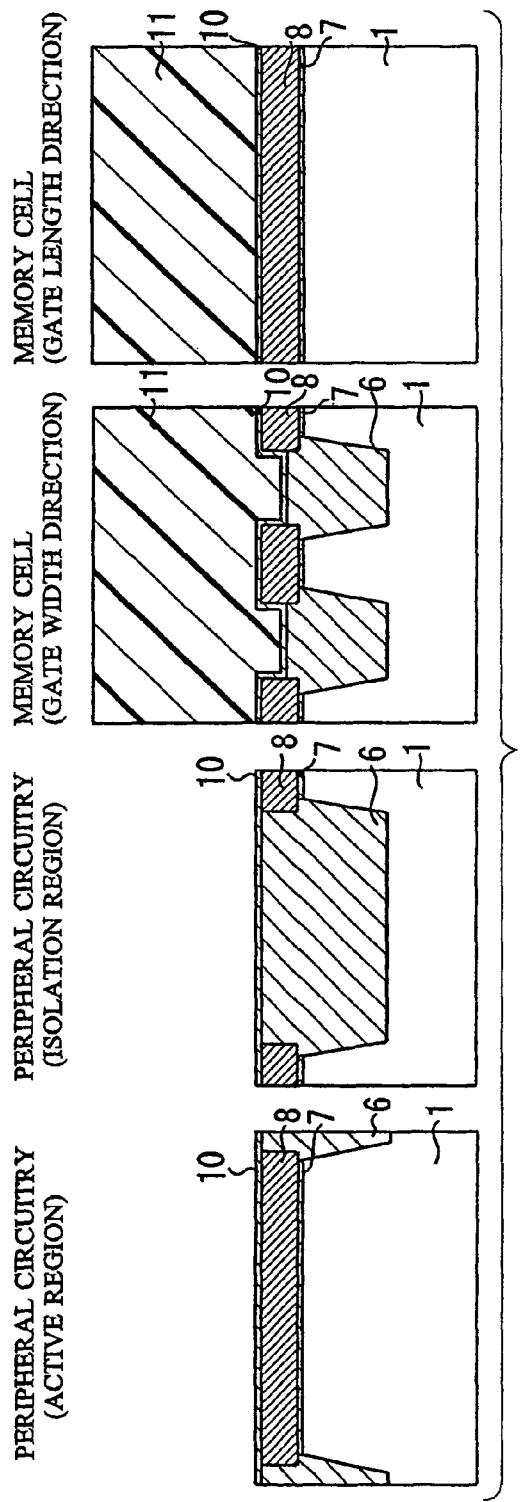

Next, as FIG. 6A shows, an ONO film 10 is formed as a multilayer insulation film on the entire surface of the substrate 1. The ONO film 10 is a three-layer insulation film formed by laminating a silicon oxide film, a silicon nitride film, and a silicon oxide film. In place of the ONO film 10, a two-layer insulation film formed by laminating a silicon oxide film and a silicon nitride film (ON film or NO film), or a four-layer insulation film formed by alternately laminating silicon oxide films and silicon nitride films (ONON film or NONO film) can be formed.

Further, a resist pattern 11 covering the memory cell region, whose portion corresponding to the peripheral circuitry region is opened, is formed using photoengraving.

Figure 6B:
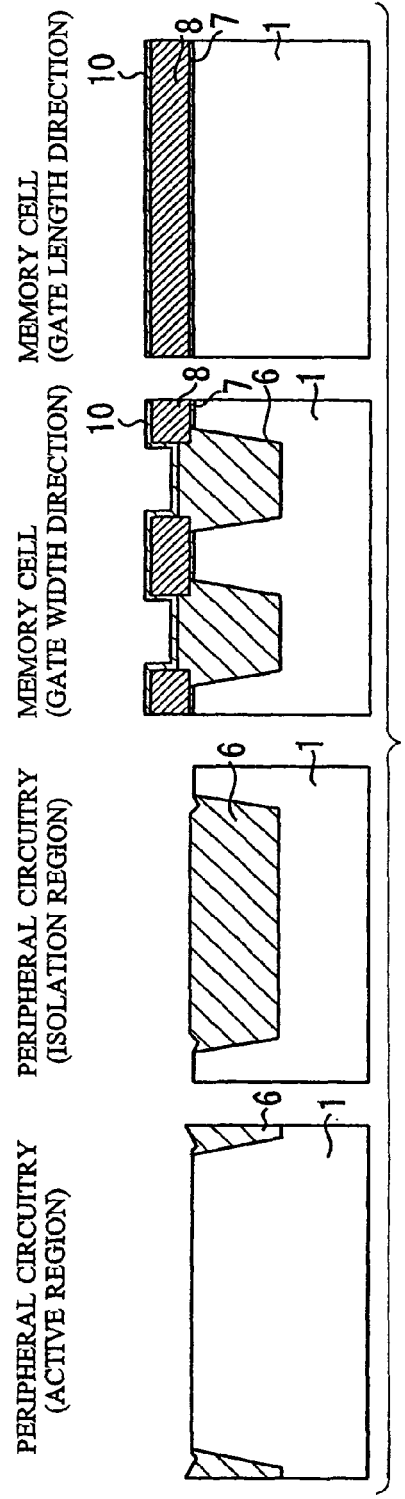

Next, as FIG. 6B shows, the ONO film 10 and the polysilicon film 8 of the peripheral circuitry are sequentially subjected to dry etching. Then the thermal oxide film 7 of the peripheral circuitry region is removed using hydrofluoric acid. Here, as described above, when the isolation oxide film 6 in the memory cell is etched, the isolation oxide film 6 in the peripheral circuitry is masked by the resist pattern 9, and is not etched. Therefore, when the thermal oxide film 7 is removed, the surface of the isolation oxide film 6 does not fall below the surface of the substrate 1 unlike examples of Background Art. Specifically, by performing normal etching treatment, the step B formed in peripheral circuitry as shown in FIG. 22A according to Background Art is not formed in the present invention. In other words, the upper surface of the isolation oxide film 6 in the peripheral circuitry has the same height as the surface of the substrate 1, or is higher than the surface of the substrate 1.

Thereafter, the resist pattern 11 is removed.

Next, as FIG. 7A shows, a silicon oxide film 12 to be a gate insulation film having a thickness of for example about 15 nm is formed on an exposed surface of the substrate of the peripheral circuitry using the thermal oxidation method. Then, a polysilicon film 13 and a tungsten silicide film (hereafter referred to as "WSi film") 14 to be the control gate electrode of the memory cell and to be the gate electrode of the peripheral circuitry, respectively, are formed on the entire surface of the substrate 1. Further, a silicon nitride film 15 is formed on the WSi film 14. A resist pattern 16 covering the control gate electrode portion of the memory cell and the gate electrode portion of the peripheral circuitry is formed on the silicon nitride film 15 using photoengraving.

Next, as FIG. 7B shows, the silicon nitride film 15 is subjected to dry etching using the resist pattern 16 as a mask. Thereafter, the resist pattern 16 is removed. Then the WSi film 14 and the polysilicon film 13 are sequentially subjected to dry etching using the patterned silicon nitride film 15 as a mask. Thereby, control gate electrodes (13, 14) are formed in the memory cell, and gate electrodes (13, 14) are formed in the peripheral circuitry. At this time, since no step is present on the isolation oxide film 6 of the peripheral circuitry as described above, the formation of etching residues can be suppressed.

Next, a resist pattern covering the peripheral circuitry is formed using photoengraving. Then the ONO film 10 and the polysilicon film 8 are sequentially subjected to dry etching using the patterned silicon nitride film 15, the WSi film 14, and the polysilicon film 13 as masks. Thereafter, source/drain regions 18 are formed in the upper layer of the substrate 1 of the memory cell using an ion implantation method. Then, the resist pattern is removed. Next, after the thermal oxidation of gate sidewalls, a silicon nitride film 19 is formed on the entire surface of the substrate to obtain the structure as shown in FIG. 8A.

Next, the silicon nitride film 19 is etched back to form self-aligned sidewalls 20 covering the sidewalls of the gate electrode. Then, after forming a resist pattern covering the memory cell, source/drain regions 21 are formed in the upper layer of the substrate 1 of the peripheral circuitry using an ion implantation method. Thereby, the structure as shown in FIG. 8B is obtained.

Figure 9:
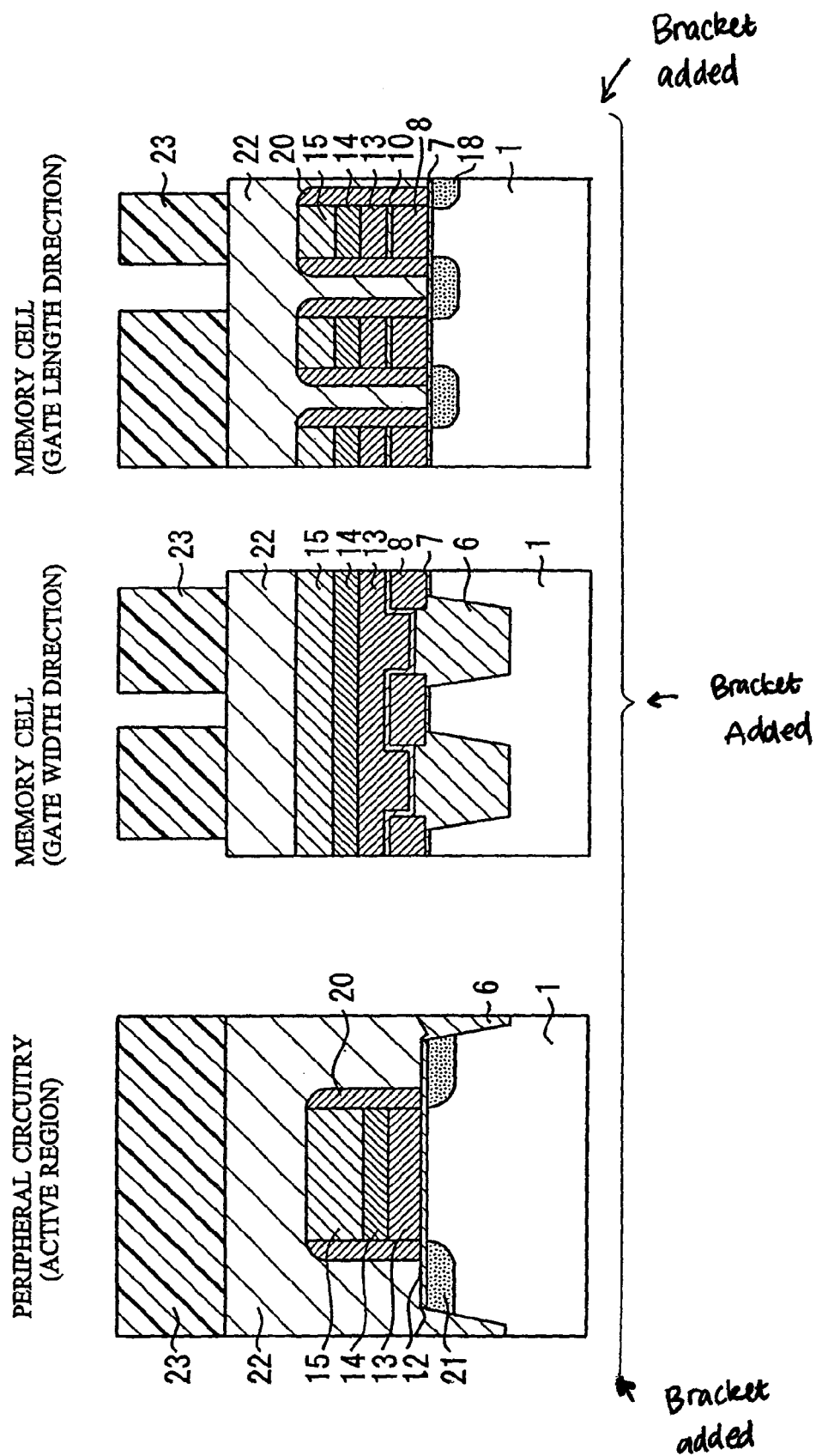
Figures 10A, 10B:
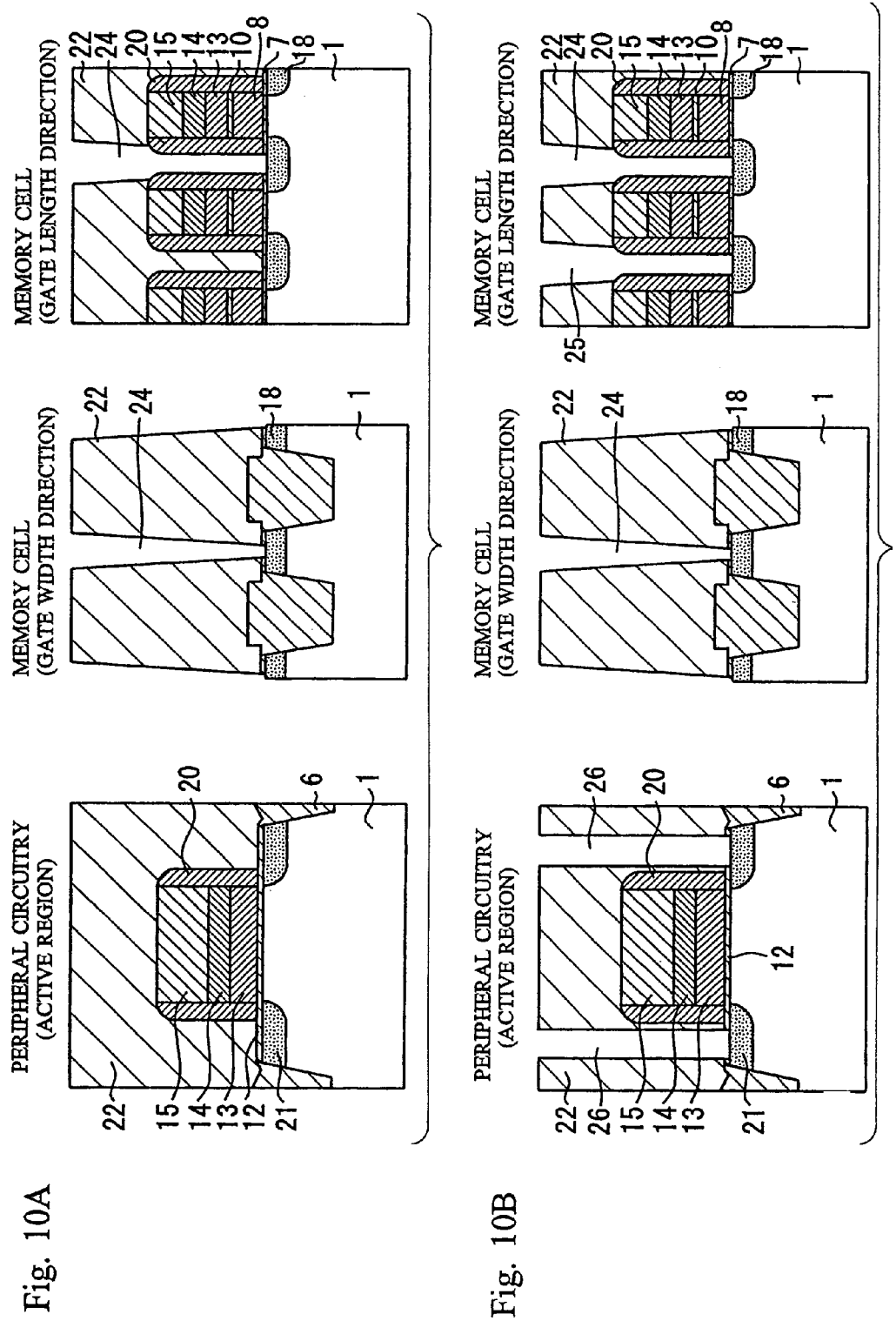

Next, as FIG. 9 shows, a BPSG (boronic phosphoric silicate glass) film 22 to be an interlayer insulation film is formed on the entire surface of the substrate 1. Then a resist pattern 23, whose portions for forming contact holes are opened, is formed on the BPSG film 22 using photoengraving. Further, as FIG. 10A shows, the BPSG film 22 is subjected to dry etching using the resist pattern 23 as a mask to form a contact hole 24 that reaches the source/drain region 18. Thereafter, the resist pattern 23 is removed. In the same manner, as FIG. 10B shows, contact holes 25 and 26 reaching the source/drain regions 18 and 21, respectively, are formed. Although the cross sections of the memory cell (in the gate width direction) shown in FIGS. 1A to 9 are the cross sections of the gate electrode portion, the cross sections of the memory cell (in the gate width direction) shown in FIGS. 10 and 11 are the cross sections of the contact portions.

A tungsten film is deposited on the entire surface of the substrate 1. The tungsten film is planarized by a CMP method or etched back using the BPSG film 22 as a stopper film. Thereby, as FIG. 11A shows, tungsten plugs 27 are formed in contact holes 24, 25 and 26.

Next, a BPSG film 28 is formed as an interlayer insulation film on the BPSG film 22 and plugs 27. Then, a resist pattern, whose portions for forming via holes are opened, is formed on the BPSG film 28 using photoengraving. Further, the BPSG film 28 is subjected to dry etching using the resist pattern as a mask to form via holes that reach the desired plug 27. Thereafter, the resist pattern is removed. Then, a tungsten film is deposited on the entire surface of the substrate 1, and planarized by a CMP method or etched back using the BPSG film 28 as a stopper film to form tungsten plugs 29 in via the holes. Finally, aluminum wirings 30 connected to the tungsten plugs 29 are formed. Thereby, the structure as shown in FIG. 11B is obtained.

In this embodiment, as described above, the isolation oxide film 6 in the memory cell is etched using the resist pattern 9 as a mask. The formation of the step from the surface of the substrate 1 on the isolation oxide film 6 in the peripheral circuitry can be suppressed when the ONO film 10, the polysilicon film 8, and the thermal oxide film 7 are thereafter removed. Therefore, the formation of etching residues of the polysilicon film on the isolation oxide film 6 in the peripheral circuitry can be prevented. The reliability of the non-volatile semiconductor memory device can be improved.

Next, a comparative example to the above-described embodiment will be described.

Figure 15:
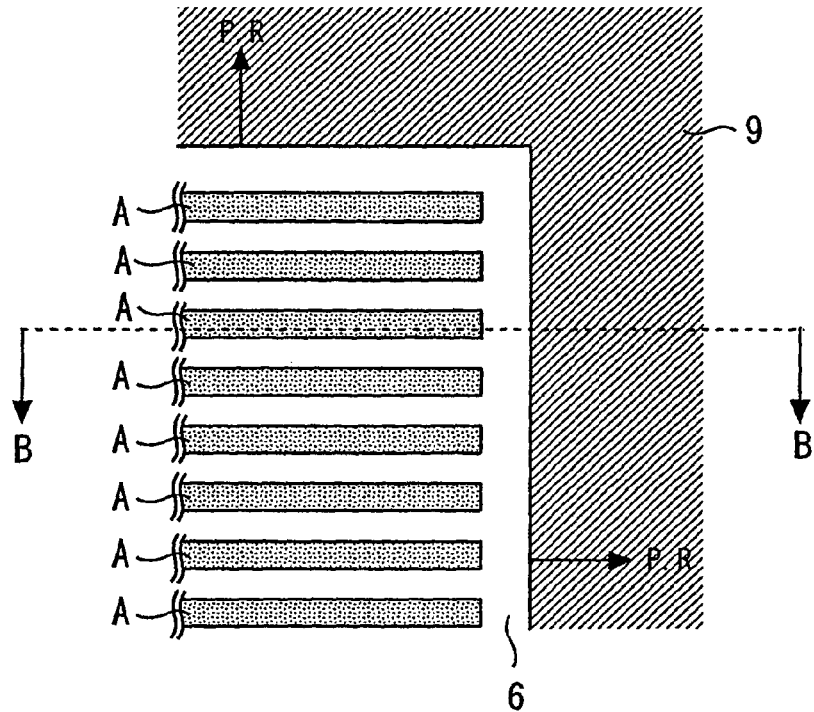
FIG. 15 is a top view showing positional relationship between active regions in a memory cell and a resist pattern covering a peripheral circuitry according to comparative example.

FIG. 15 is a top view showing the positional relationship between the active regions in the memory cell and the resist pattern that covers the peripheral circuitry according to a comparative example.

In the above-described embodiment, as FIGS. 13 and 14 show, the end portion of the resist pattern 9 is disposed on the active region A' surrounding the end portion of the memory cell array. Thereby, the isolation oxide film 6 in the boundary area between the memory cell and the peripheral circuitry is not etched, and the formation of the step can be prevented. Specifically, in the non-volatile semiconductor memory device manufactured using the method according to the above-described embodiment, the upper surface of the isolation oxide film 6 in the boundary area between the memory cell and the peripheral circuitry has the same height of the surface of the substrate 1, or is higher than the surface of the substrate 1.

Figure 16:
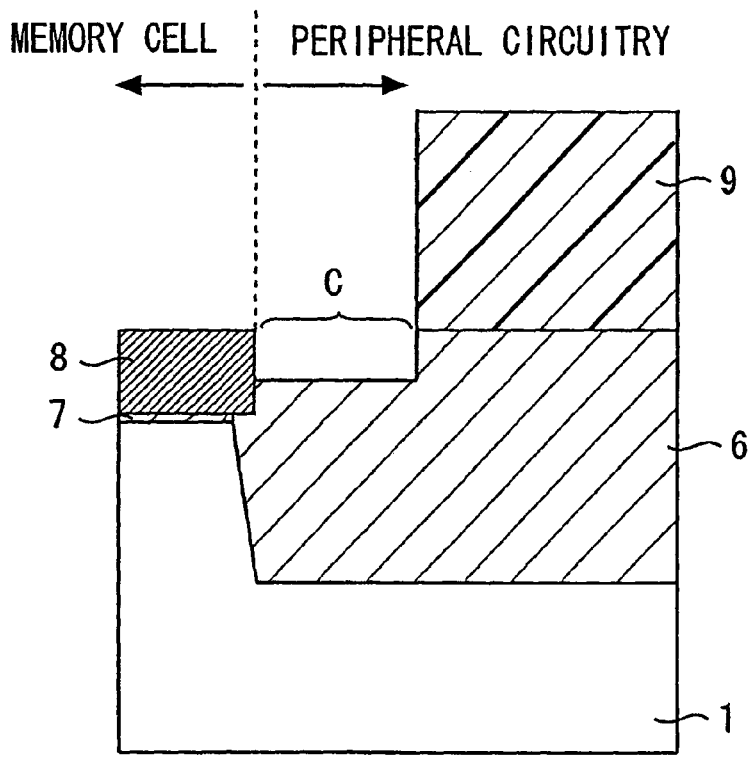
FIG. 16 is a sectional view for illustrating a step formed in the comparative example.
Figure 20A:
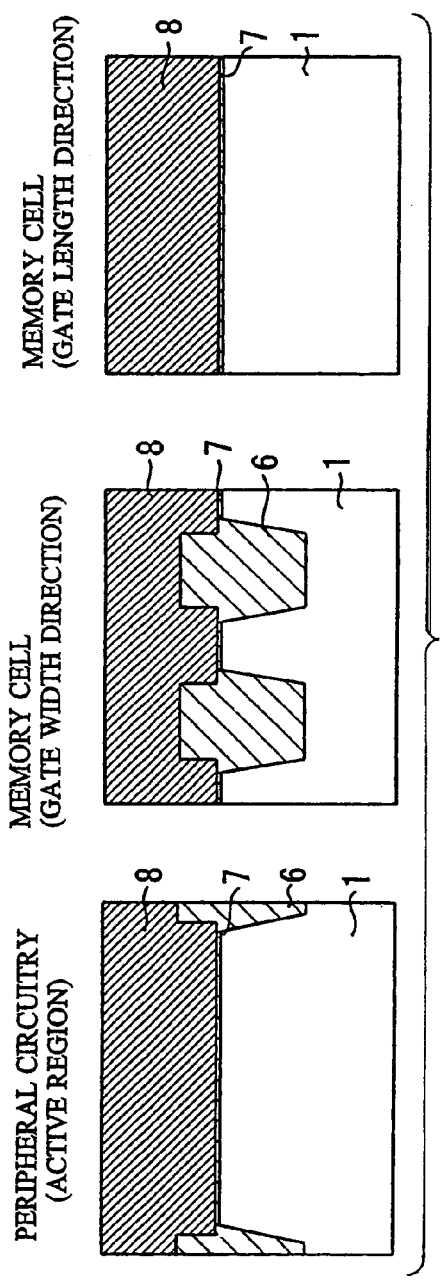
Figure 20B:
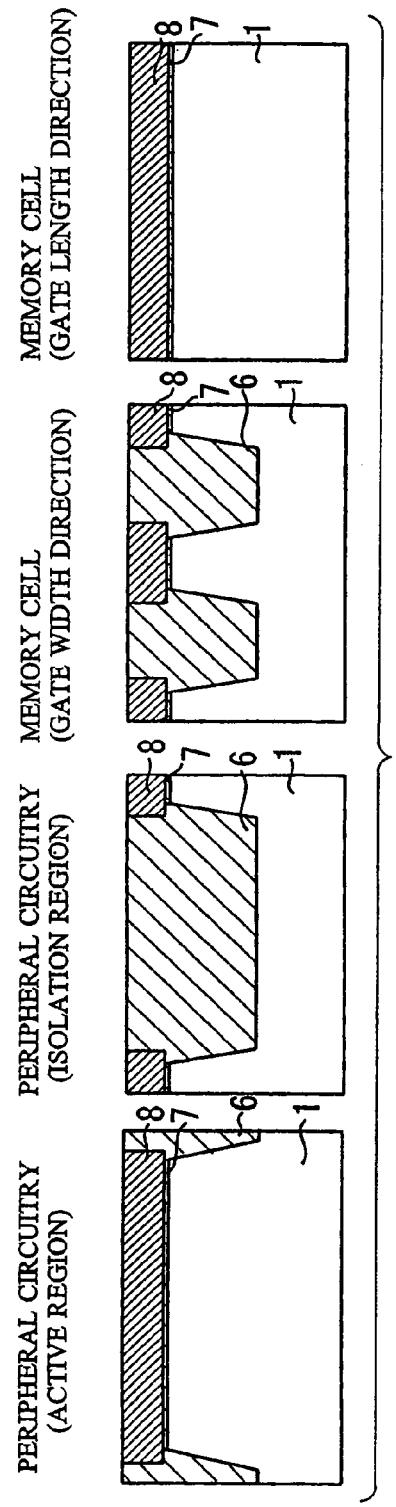
Figure 21A:
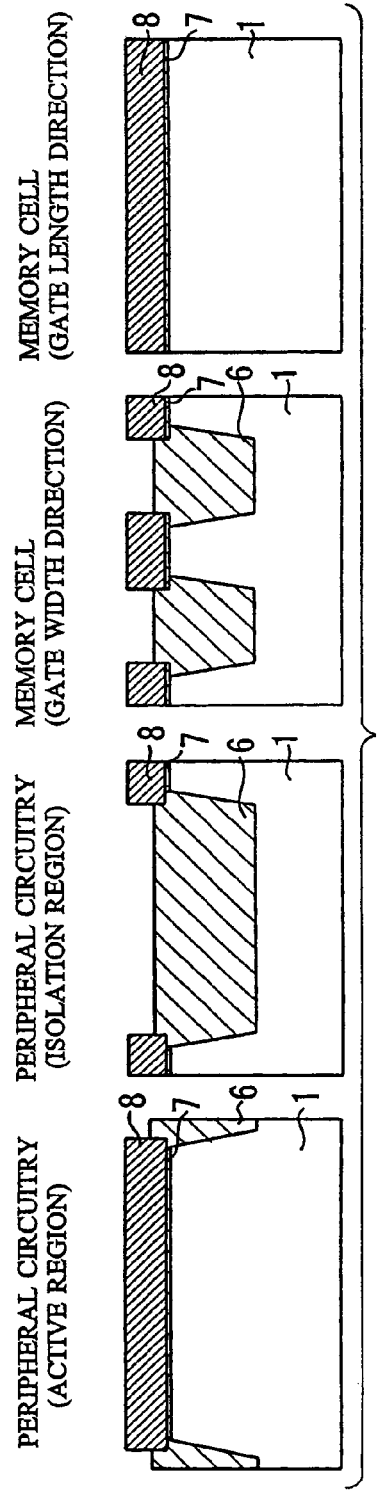
Figure 21B:
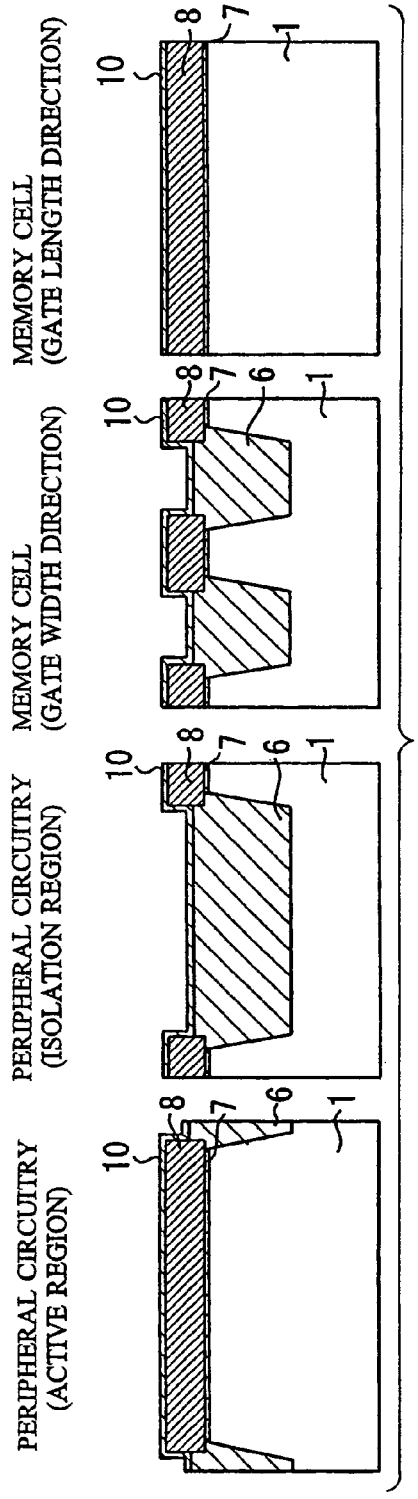
Figure 23A:
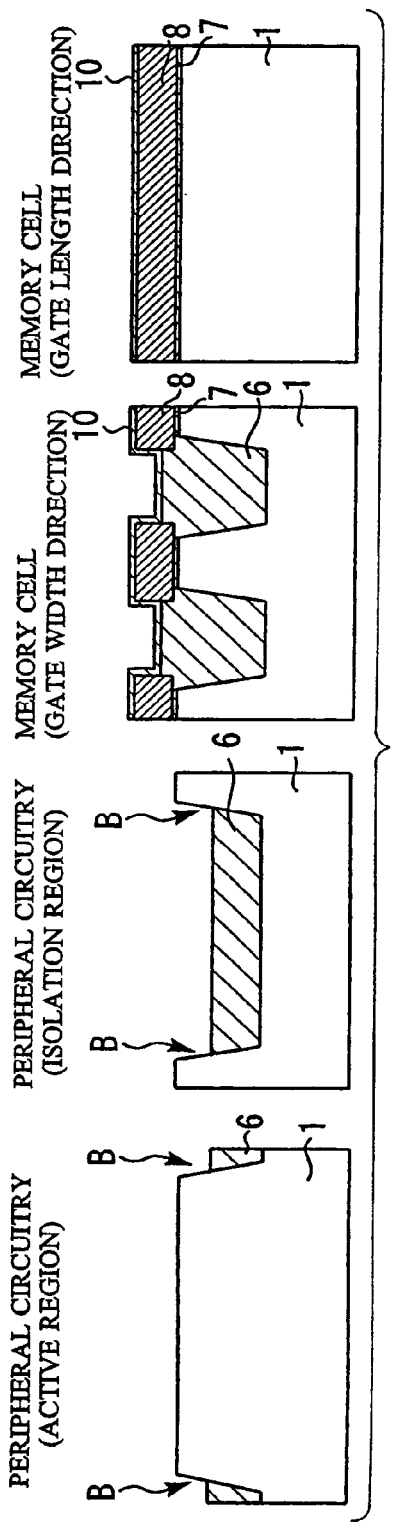
Figure 23B:
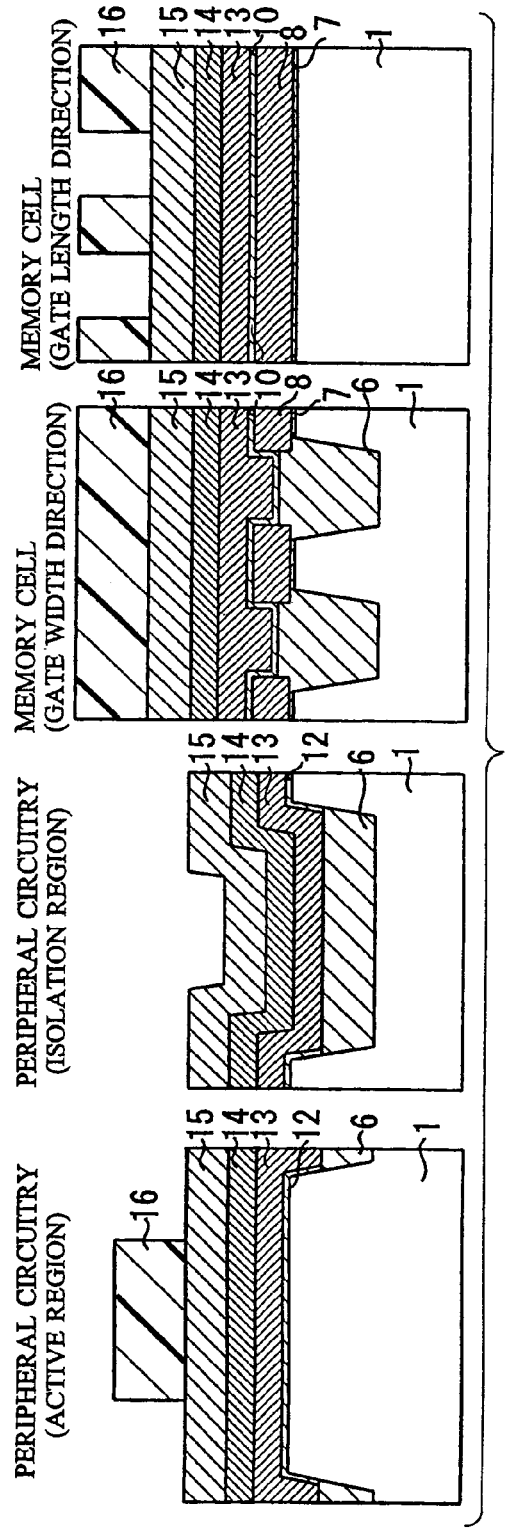
Figure 24:
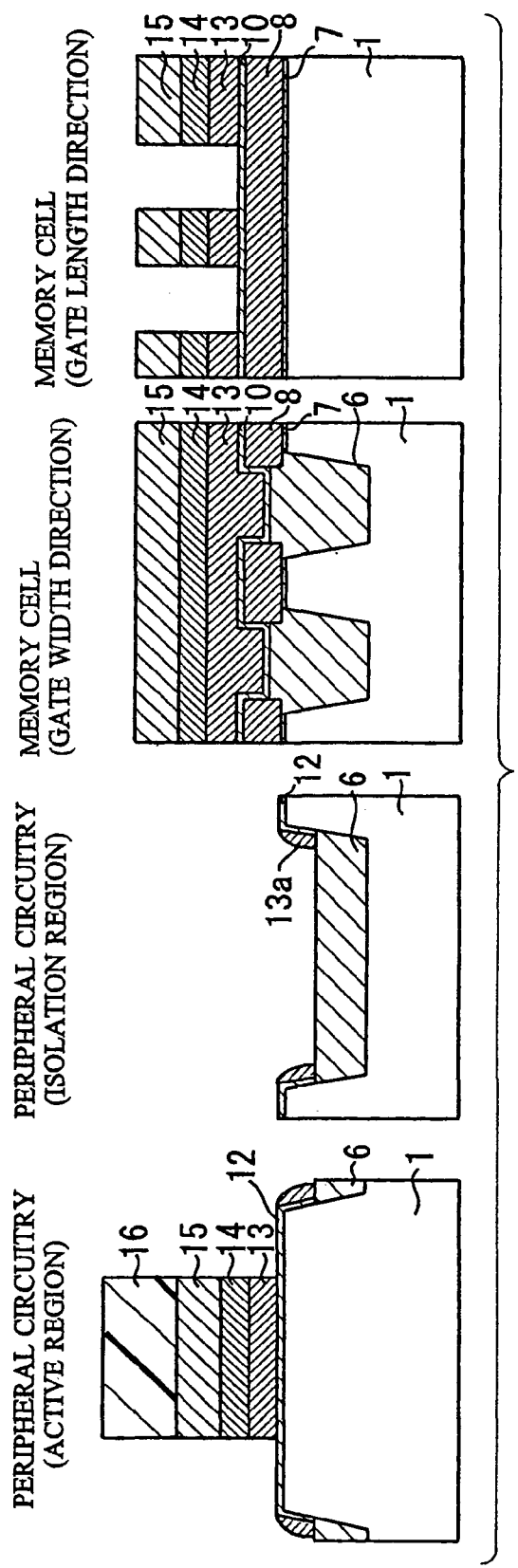

On the other hand, in this comparative example, as FIG. 15 shows, no active region A' that connects the end portions of rectangular active regions A is formed. Further, the end portion of the resist pattern 9 is disposed on the isolation oxide film 6 in the boundary area between the memory cell and the peripheral circuitry. In this case, as FIG. 16 shows, the isolation oxide film 6 in the area not covered with the resist pattern 9 is etched resulting in the formation of the step C. The step C causes the step of the isolation oxide film 6 as formed in peripheral circuitry of Background Art in the boundary area between the memory cell and the peripheral circuitry to be formed when the ONO film 10, the polysilicon film 8. Further, the thermal oxide film 7 are thereafter removed.

In this embodiment, by disposing the end portion of the resist pattern 9 on the active region A', the formation of such a step C can be prevented. Therefore, the formation of the step on the isolation oxide film 6 in the boundary area between the memory cell and the peripheral circuitry can be prevented, and further, the formation of etching residues can be prevented.

This invention, when practiced illustratively in the manner described above, provides the following major effects:

The present invention can suppress the formation of a step on the element isolation structure of the peripheral circuitry to the surface of the substrate. The formation of etching residues in the step can be prevented, when the multilayer insulation film, the polysilicon film, and the silicon oxide film are removed, by etching only the element isolation oxide film of the memory cell using the first resist pattern as a mask.

Further, the present invention is not limited to these embodiments, but variations and modifications may be made without departing from the scope of the present invention.

The entire disclosure of Japanese Patent Application No. 2004-200913 filed on Jul. 7, 2004 containing specification, claims, drawings and summary are incorporated herein by reference in its entirety.

What is claimed is:

1. A non-volatile semiconductor memory device having a memory cell and peripheral circuitry adjacent to the memory cell, comprising:
   element isolation structures for isolating active regions in a substrate; and
   semiconductor elements formed on the active regions,
   wherein the active regions of the memory cell include:
      a plurality of rectangular first active regions arrayed in the lateral direction; and
      second active regions connecting ends of the first active regions to each other, the second active regions surrounding the memory cell, and
   wherein an upper surface of the element isolation structure in the peripheral circuitry has a height equivalent to a height of the surface of the substrate, or higher than the height of the surface of the substrate.

* * * * *